Figure 1:
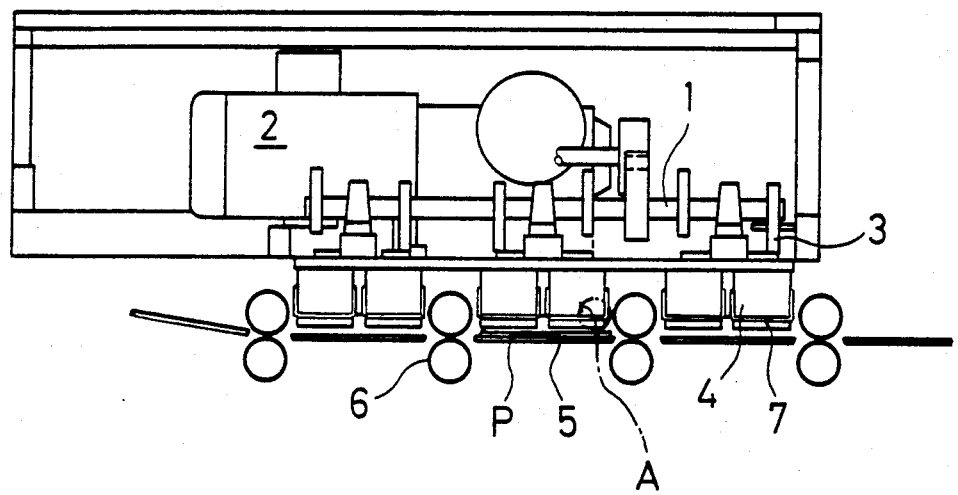

United States Patent [19]

Hecke et al.

[11] Patent Number: 4,497,081
[45] Date of Patent: Feb. 5, 1985

[54] APPARATUS FOR TREATING PRINTING PLATES

[75] Inventors: Paul Hecke; Arnulf Bürger, both of Ludwigshafen; Heinz-Ulrich Werther, Wachenheim, all of Fed. Rep. of Germany

[73] Assignee: BASF Aktiengesellschaft, Ludwigshafen, Fed. Rep. of Germany

[21] Appl. No.: 499,264

[22] Filed: May 31, 1983

[30] Foreign Application Priority Data

Jun. 4, 1982 [DE] Fed. Rep. of Germany ....... 3221257

[51] Int. Cl.³ ............................................ G03D 13/00
[52] U.S. Cl. ....................................... 15/102; 15/100; 354/317
[58] Field of Search ............................ 15/100, 102, 77; 354/317, 318

[56] References Cited

U.S. PATENT DOCUMENTS

| 1,619,925 | 3/1927 | Flockhart | 15/102 X |
| 2,677,320 | 5/1954 | Coughlin | 354/317 X |
| 3,046,774 | 7/1962 | Glock | 15/77 |
| 3,995,343 | 12/1976 | Horner | 15/102 X |
| 4,222,656 | 9/1980 | Harrell | 15/102 X |

Primary Examiner—Edward L. Roberts
Attorney, Agent, or Firm—Keil & Weinkauf

[57] ABSTRACT

A printing plate produced by a photochemical process is treated using an apparatus in which one or more flat washout elements are arranged facing the exposed side of the plate passing through the apparatus, these washout elements moving to and fro at right angles to the direction of transport of the plate and being covered with a long-fibered fabric on the side facing the plate.

3 Claims, 3 Drawing Figures

APPARATUS FOR TREATING PRINTING PLATES

The present invention relates to an apparatus for treating printing plates produced by a photochemical process, in particular printing plates produced from photopolymerizable substances and exposed to actinic light, in which the plate to be treated is transported from a loading station, via a washout station, a cleaning station and a drying station, to an unloading station by means of a system of driven rollers covered with velour or textile fabrics, and in which, during transportation through the washout and cleaning stations, the exposed side of the plate faces upwards and the plate is below the level of the washout liquid.

Printing plates produced by photochemical processes are principally used in newspaper printing, for printing packaging and in jobbing work.

It is known that, after imagewise exposure, the printing plate can be washed out by means of a solvent liquid using a washout apparatus comprising a number of nozzles, or brushes mounted at right angles to the exposed plate and rotating in opposite directions, i.e. the nonexposed areas of the exposed printing plate are removed during the washout operation.

However, these types of apparatus, which at the present time are the principal ones used for printing plates, have various disadvantages: for example, a very large amount of washout liquid is required for the washout process, and, furthermore, a large amount of electrical energy is required to drive the pump which circulates the washout liquid. Printing quality in the case of newspaper printing, the printing of packaging and jobbing work is adversely affected, for example, by the fact that exposed areas are also removed from the printing plates by the rotating brushes.

It is an object of the present invention to eliminate the above disadvantages, i.e. to reduce the consumption of washout liquid and of electrical energy, and to replace the brushing procedure during the washout process, which procedure causes damage to the exposed printing plate, by another process in which the plate is subjected to gentle treatment.

We have found that this object is achieved, in accordance with the invention, by an apparatus wherein one or more flat washout elements are arranged facing the exposed side of the plate passing through the apparatus, these washout elements moving to and fro at right angles to the direction of transport of the plate and being covered with a long-fibered fabric on the side facing the plate.

The sub-claims relate to further features of the novel apparatus.

Figure 2:
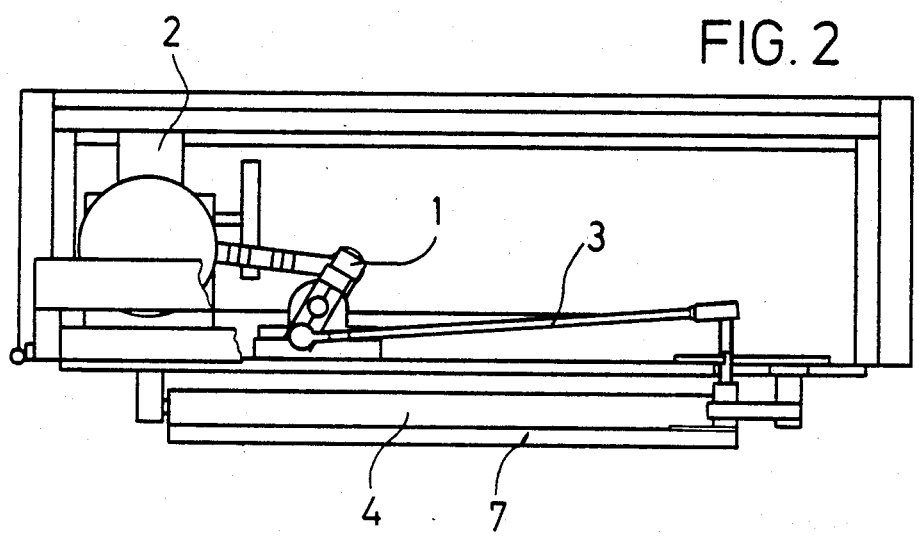
Figure 3:
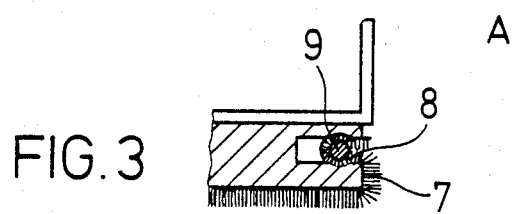

Further details of the invention are disclosed in the following description of an embodiment given by way of example and illustrated in the accompanying drawings, in which FIG. 1 is a side view of the apparatus according to the invention, FIG. 2 is an end view of the apparatus according to the invention, and FIG. 3 shows a detail of that portion of the apparatus designated by the letter "A" in FIG. 1.

FIGS. 1 and 2 show a rod assembly comprising a pivotable rod 1, which is driven by a gear motor 2, and in turn moves six individual reciprocable rods 3, each of which is connected by a vertical post to a washout element 4. The printing plates P are transported on table 5 by means of the driven rollers 6. A long-fibered fabric 7 is stretched over the under-side of washout element 4, and the method of fastening this fabric to the washout element is shown in FIG. 3. Each of the two sides of washout element 4 which are at right angles to the direction of transport possesses a milled groove 8 over its entire length, clamping members 9 being pressed into these grooves. As shown in FIG. 3, the long-fibered fabric 7 is clamped, along the entire length of each groove 8, between the upper and lower sides of the groove on the one hand and the clamping member 9 on the other hand.

To illustrate the design of the novel apparatus, the washout operation will now be described. The exposed printing plate is transported through the washout and cleaning stations by means of the driven rollers and the table. The exposed side of the printing plate faces upwards, and its entire surface is covered by washout liquid.

During transportation of the printing plate, the material from the non-exposed areas is rubbed away by means of the long-fibered fabric, which rests on the printing plate and is caused to execute to-and-fro movements by the drive; the material removed by rubbing then dissolves in the washout liquid.

The particular advantages achieved with the apparatus of the invention, in comparison with conventional apparatuses, are that a smaller amount of washout fluid and a smaller amount of electrical energy are consumed in the washout operation. The non-exposed areas of the printing plate are washed out in a gentler manner with the novel apparatus than with rotating brushes, with the result that the risk of exposed areas being removed is virtually eliminated.

We claim:

1. An improved apparatus for treating a printing plate produced by a photochemical process, in particular a printing plate produced from photopolymerizable substances and exposed to actinic light, in which the plate to be treated is transported from a loading station, via a washout station, a cleaning station and a drying station, to an unloading station by means of a system of driven rollers covered with velour or textile fabrics, and in which, during transportation through the washout and cleaning station, the exposed side of the plate faces upwards and the plate is below the level of the washout liquid, said improvement comprising: at least one flat washout element is arranged facing the exposed side of the plate passing through the apparatus, said washout element being reciprocable to and fro at right angles to the direction of transport of the plate and having an underside and sidewalls extending at right angles to said direction; a groove in each of said sidewalls; and a long-fibered fabric stretched across the underside of said washout element facing the plate and fastened in said grooves by means of clamping members.

2. An apparatus as claimed in claim 1, wherein two or more washout elements moving in opposite directions are arranged one behind the other in the path of movement of the printing plate through the apparatus.

3. An apparatus as claimed in claim 1 wherein the long-fibered fabric is a velour.

* * * * *